(12) United States Patent
Wang et al.

(10) Patent No.: US 12,707,911 B2
(45) Date of Patent: Aug. 11, 2026

(54) INTRODUCTION OF METAL IN HARD MASK FOR HIGH ASPECT RATIO DEVICE PATTERNING

(71) Applicant: Applied Materials, Inc., Santa Clara, CA (US)

(72) Inventors: Han Wang, Palo Alto, CA (US); Chao Li, Santa Clara, CA (US); Yu Yang, Santa Clara, CA (US); Gene Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 302 days.

(21) Appl. No.: 18/637,181

(22) Filed: Apr. 16, 2024

(65) Prior Publication Data

US 2024/0395561 A1 Nov. 28, 2024

Related U.S. Application Data

(60) Provisional application No. 63/468,661, filed on May 24, 2023.

(51) Int. Cl.

*H10P 50/00* (2026.01)
*H01J 37/32* (2006.01)
*H10P 50/28* (2026.01)

(52) U.S. Cl.

CPC ............ *H10P 50/73* (2026.01); *H01J 37/321* (2013.01); *H10P 50/285* (2026.01); *H01J 2237/334* (2013.01)

(58) Field of Classification Search

CPC ...... H10P 50/73; H10P 50/285; H10P 50/283; H10P 76/405; H01J 37/321; H01J 2237/334

See application file for complete search history.

(56) References Cited

U.S. PATENT DOCUMENTS 10,515,821 B1 12/2019 Dole et al.
11,404,279 B2 * 8/2022 Ohori ................ H01J 37/32449
(Continued)

FOREIGN PATENT DOCUMENTS

KR 102403619 B1 5/2022
KR 102403856 B1 5/2022
(Continued)

OTHER PUBLICATIONS

International Search Report and Written Opinion dated Jul. 25, 2024 for Application No. PCT/US2024/024724.

*Primary Examiner* — Joshua L Allen
*Assistant Examiner* — Christopher Remavege
(74) *Attorney, Agent, or Firm* — Patterson + Sheridan, LLP

(57) ABSTRACT

A method for patterning a boron-containing hard mask includes patterning an oxide hard mask formed on a boron-containing hard mask, and patterning the boron-containing hard mask using the patterned oxide hard mask, wherein the oxide hard mask comprises silicon oxide ($SiO_2$), the boron-containing hard mask is doped with one or more metal elements, and the patterning of the boron-containing hard mask comprises etching the boron-containing hard mask through openings of the patterned oxide hard mask using an etching gas mixture comprising chlorine ($Cl_2$), hydrogen bromide (HBr), and oxygen ($O_2$).

20 Claims, 3 Drawing Sheets

200

ETCH BACK PROCESS: REMOVE A DARC LAYER ON A BARC LAYER — 210

OXIDE HARD MASK PATTERNING PROCESS: OPEN AN OXIDE HARD MASK THROUGH OPENINGS OF THE PATTERNED BARC LAYER AND STOP AT A BORON-CONTAINING HARD MASK — 220

BORON-CONTAINING HARD MASK PATTERNING PROCESS: OPEN THE BORON-CONTAINING HARD MASK THROUGH THE OPENINGS OF THE PATTERNED OXIDE HARD MASK — 230

(56) References Cited

U.S. PATENT DOCUMENTS

| | | | | |
|---|---|---|---|---|
| 12,020,944 | B2 * | 6/2024 | Dole | H01J 37/32449 |
| 12,550,651 | B2 * | 2/2026 | Wang | H10P 50/285 |
| 2015/0064914 | A1 * | 3/2015 | Kong | H10P 76/405<br>438/725 |
| 2016/0314982 | A1 * | 10/2016 | Kihara | C23C 16/402 |
| 2018/0068862 | A1 * | 3/2018 | Terakura | H01J 37/32082 |
| 2018/0166276 | A1 | 6/2018 | Nakao et al. | |
| 2021/0057229 | A1 * | 2/2021 | Ohori | H01J 37/32449 |
| 2021/0335624 | A1 * | 10/2021 | Dole | H01J 37/32449 |
| 2022/0341034 | A1 * | 10/2022 | Aydin | C23C 16/042 |
| 2022/0367186 | A1 * | 11/2022 | Fung | H10P 50/73 |
| 2022/0392772 | A1 * | 12/2022 | Liu | H01J 37/32174 |
| 2023/0178343 | A1 * | 6/2023 | Tomura | H01J 37/32449<br>216/41 |
| 2023/0307245 | A1 * | 9/2023 | Mukaiyama | H01J 37/32449 |
| 2023/0377956 | A1 * | 11/2023 | Chen | H10W 20/074 |
| 2024/0266185 | A1 * | 8/2024 | Wang | H10P 50/285 |
| 2024/0395561 | A1 * | 11/2024 | Wang | H10P 50/285 |

FOREIGN PATENT DOCUMENTS

| | | | |
|---|---|---|---|
| WO | 2022241042 | A1 | 11/2022 |
| WO | 2023008025 | A1 | 2/2023 |

* cited by examiner 300
312
310
308
306
304
302B
302A
302

INTRODUCTION OF METAL IN HARD MASK FOR HIGH ASPECT RATIO DEVICE PATTERNING

CROSS-REFERENCE TO RELATED APPLICATIONS

This application claims priority to U.S. Provisional Application Ser. No. 63/468,661 filed May 24, 2023, which is herein incorporated by reference in its entirety.

BACKGROUND

Field

Embodiments described herein generally relate to semiconductor device fabrication, and more particularly to hard masks used for high aspect ratio structures patterning and methods for forming the same.

Description of the Related Art

The semiconductor manufacturing industry continues to address node-to-node critical dimension (CD) and pitch reduction and aspect ratio increase. Etching high aspect ratio structures is a critical process in dynamic random access memory (DRAM) devices and three dimensional (3D) NAND devices, in which etch variability and defects must be kept low to avoid degradation caused by missing holes and bottom distortion. Etching high aspect ratio device structures typically uses a hard mask for etching device molds and an oxide mask for etching the hard mask. However, defects in the hard mask openings are transferred into the device molds and cause device degradation.

Therefore, there is a need for improved hard masks for patterning high aspect ratio structures, and methods to fabricate the same.

SUMMARY

Embodiments of the present disclosure provide a method for patterning a boron-containing hard mask. The method includes patterning an oxide hard mask formed on a boron-containing hard mask, and patterning the boron-containing hard mask using the patterned oxide hard mask, wherein the oxide hard mask comprises silicon oxide ($SiO_2$), the boron-containing hard mask is doped with one or more metal elements, and the patterning of the boron-containing hard mask comprises etching the boron-containing hard mask through openings of the patterned oxide hard mask using an etching gas mixture comprising chlorine ($Cl_2$), hydrogen bromide (HBr), and oxygen ($O_2$).

Embodiments of the present disclosure provide a method for patterning a boron-containing hard mask. The method includes patterning an oxide hard mask formed on a boron-containing hard mask, and patterning the boron-containing hard mask using the patterned oxide hard mask, wherein the oxide hard mask comprises silicon oxide ($SiO_2$), and the patterning of the boron-containing hard mask comprises etching the boron-containing hard mask through openings of the patterned oxide hard mask using an etching gas mixture comprising chlorine ($Cl_2$), hydrogen bromide (HBr), oxygen ($O_2$), and a metal-containing etchant.

Embodiments of the present disclosure provide a method for patterning a boron-containing hard mask. The method includes patterning an oxide hard mask formed on a boron-containing hard mask, and patterning the boron-containing hard mask using the patterned oxide hard mask, wherein the oxide hard mask comprises silicon oxide ($SiO_2$), the boron-containing hard mask is doped with one or more metal elements, and the patterning of the boron-containing hard mask comprises etching the boron-containing hard mask through openings of the patterned oxide hard mask using an etching gas mixture comprising chlorine ($Cl_2$), hydrogen bromide (HBr), oxygen ($O_2$), and a metal-containing etchant.

BRIEF DESCRIPTION OF THE DRAWINGS

So that the manner in which the above recited features of the embodiments herein are attained and can be understood in detail, a more particular description of the disclosure, briefly summarized above, may be had by reference to the examples thereof which are illustrated in the appended drawings.

FIGS. 3A, 3B, 3C, and 3D are cross-sectional views of a structure formed during the patterning process depicted in FIG. 2 according to one embodiment.

Figure 1:
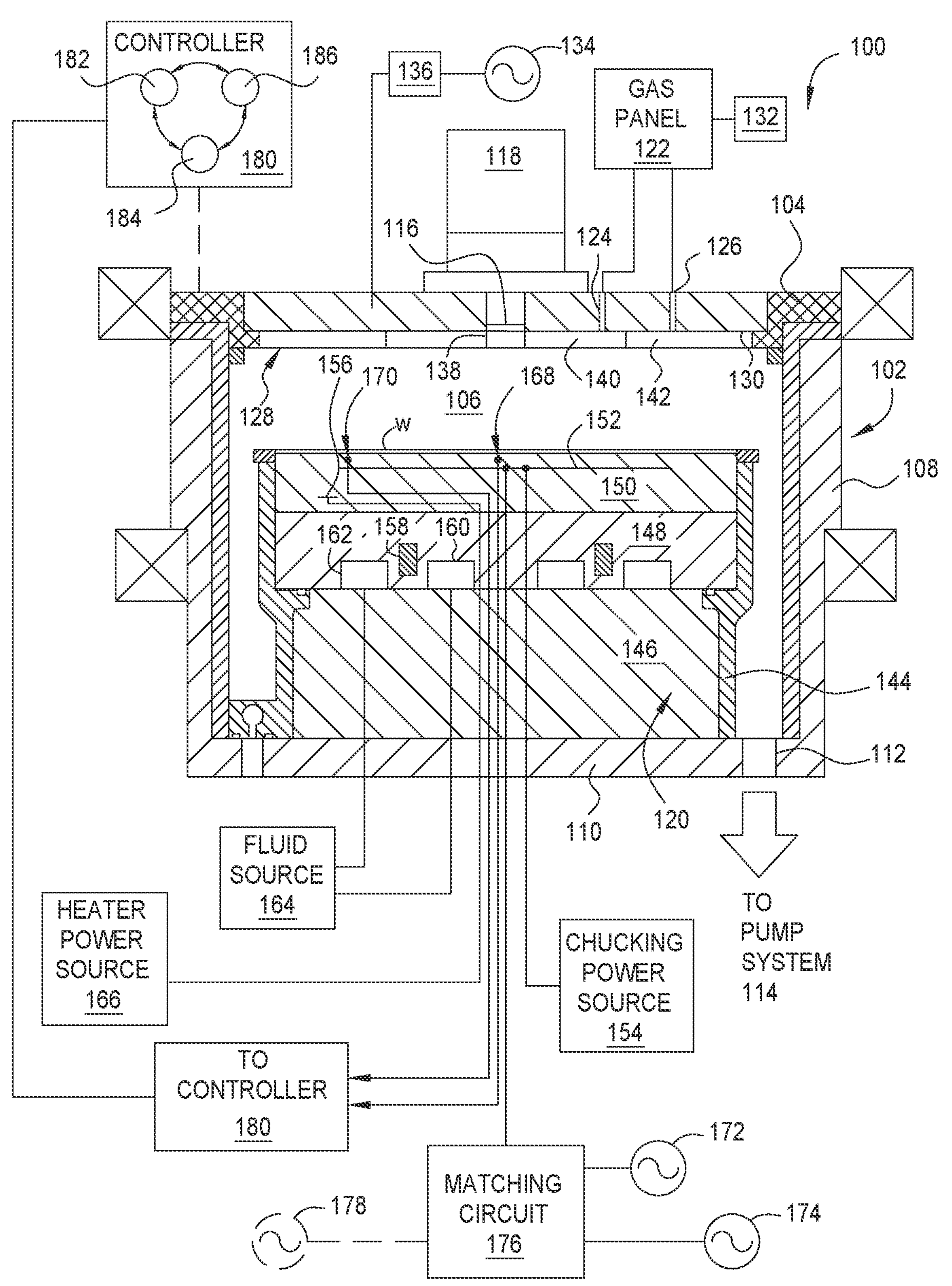
FIG. 1 is a cross-sectional view of a processing chamber according to one embodiment.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary examples and are therefore not to be considered limiting of the scope of the disclosure, for the disclosure may admit to other equally effective embodiments.

DETAILED DESCRIPTION

In the embodiments described herein, boron-containing hard masks used for patterning high aspect ratio devices such as dynamic random access memory (DRAM) capacitors and 3D NAND devices and methods for forming the same are provided. In high aspect ratio device patterning, defects in hard masks are transferred into device molds, causing device degradation. To reduce such defect in hard masks, boron-containing hard masks according to the embodiments described are doped with metal elements, which increases etch selectivity against an oxide hard mask to be used to pattern the boron-containing hard mask, and increases sidewall passivation within openings in the patterned boron-containing hard mask. As a result, local critical dimension uniformity (LCDU) of the openings in the patterned boron-containing hard mask is improved and etch variability in the high aspect ratio device patterning is reduced.

FIG. 1 is a sectional view of one example of an inductively coupled plasma (ICP) etch chamber 100 suitable for performing an etching process. Suitable ICP etch chambers that may be adapted for use with the methods disclosed herein include inductively coupled plasma reactive ion etching (ICP-RIE) chambers, for example, a CENTRIS® SYM3™ etch chamber available from Applied Materials, Inc. of Santa Clara, California. Although the ICP etch chamber 100 is shown including a plurality of features that enable superior etching performance, it is contemplated that other ICP etch chambers may be adapted to benefit from one or more of the inventive features disclosed herein.

The ICP etch chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and selectively sealed by a slit valve to facilitate entry and egress of a substrate W from the ICP etch chamber 100. An exhaust port 112 is defined in the chamber body 102 and couples the interior volume 106 to a vacuum pump system 114. The vacuum pump system 114 generally includes one or more pumps and throttle valves utilized to evacuate and regulate the pressure of the interior volume 106 of the ICP etch chamber 100.

The lid 104 is sealingly supported on the sidewall 108 of the chamber body 102. The lid 104 may be opened to allow excess to the interior volume 106 of the ICP etch chamber 100. The lid 104 includes a window 116 that facilitates optical process monitoring. In one implementation, the window 116 is comprised of quartz or other suitable material that is transmissive to a signal utilized by an optical monitoring system 118 mounted outside the ICP etch chamber 100.

The optical monitoring system 118 is positioned to view at least one of the interior volume 106 of the chamber body 102 and/or the substrate W positioned on a substrate support pedestal assembly 120 through the window 116. In one embodiment, the optical monitoring system 118 is coupled to the lid 104 and facilitates an integrated deposition process that uses optical metrology to provide information that enables process adjustment to compensate for incoming substrate pattern feature inconsistencies (such as thickness, and the like), and provides process state monitoring (such as plasma monitoring, temperature monitoring, and the like) as needed. One optical monitoring system that may be adapted to benefit from the disclosure is the EyeD® full-spectrum, interferometric metrology module, available from Applied Materials, Inc., of Santa Clara, California.

A gas panel 122 is coupled to the ICP etch chamber 100 to provide process and/or cleaning gases to the interior volume 106. In the example depicted in FIG. 1, inlet ports 124, 126 are provided in the lid 104 to allow gases to be delivered from the gas panel 122 to the interior volume 106 of the ICP etch chamber 100. In one implementation, the gas panel 122 is adapted to provide fluorinated process gas through the inlet ports 124, 126 and into the interior volume 106 of the ICP etch chamber 100.

A showerhead assembly 128 is coupled to an interior surface 130 of the lid 104. The showerhead assembly 128 includes a plurality of apertures that allow the gases flowing through the showerhead assembly 128 from the inlet ports 124, 126 into the interior volume 106 of the ICP etch chamber 100 in a predefined distribution across the surface of the substrate W being processed in the ICP etch chamber 100.

A remote plasma source 132 may be optionally coupled to the gas panel 122 to facilitate dissociating gas mixture from a remote plasma prior to entering into the interior volume 106 for processing. A radio frequency (RF) source power 134 is coupled through a matching network 136 to the showerhead assembly 128. The RF source power 134 typically is capable of producing up to about 3000 W at a tunable frequency in a range from about 50 kHz to about 200 MHz.

The showerhead assembly 128 additionally includes a region transmissive to an optical metrology signal. An optically transmissive region or passage 138 is suitable for allowing the optical monitoring system 118 to view the interior volume 106 and/or the substrate W positioned on the substrate support pedestal assembly 120. The passage 138 may be a material, an aperture or plurality of apertures formed or disposed in the showerhead assembly 128 that is substantially transmissive to the wavelengths of energy generated by, and reflected back to, the optical monitoring system 118.

In one implementation, the showerhead assembly 128 is configured with a plurality of zones that allow for separate control of gas flowing into the interior volume 106 of the ICP etch chamber 100. In the example illustrated in FIG. 1, the showerhead assembly 128 has an inner zone 140 and an outer zone 142 that are separately coupled to the gas panel 122 through separate inlet ports 124, 126.

The substrate support pedestal assembly 120 is disposed in the interior volume 106 of the ICP etch chamber 100 below the showerhead assembly 128. The substrate support pedestal assembly 120 holds the substrate W during processing. The substrate support pedestal assembly 120 generally includes a plurality of lift pins (not shown) disposed therethrough that are configured to lift the substrate W from the substrate support pedestal assembly 120 and facilitate exchange of the substrate W with a robot (not shown) in a conventional manner. An inner liner 144 may closely circumscribe the periphery of the substrate support pedestal assembly 120.

In one implementation, the substrate support pedestal assembly 120 includes a mounting plate 146, a base 148 and an electrostatic chuck 150. The mounting plate 146 is coupled to the bottom 110 of the chamber body 102 and includes passages for routing utilities, such as fluids, power lines and sensor leads, among others, to the base 148 and the electrostatic chuck 150. The electrostatic chuck 150 comprises at least one clamping electrode 152 for retaining the substrate W below showerhead assembly 128. The electrostatic chuck 150 is driven by a chucking power source 154 to develop an electrostatic force that holds the substrate W to the chuck surface, as is conventionally known. Alternatively, the substrate W may be retained to the substrate support pedestal assembly 120 by clamping, vacuum or gravity.

At least one of the base 148 or electrostatic chuck 150 may include at least one optional embedded heater 156, at least one optional embedded isolator 158, and a plurality of conduits 160, 162 to control the lateral temperature profile of the substrate support pedestal assembly 120. The conduits 160, 162 are fluidly coupled to a fluid source 164 that circulates a temperature regulating fluid therethrough. The heater 156 is regulated by a power source 166. The conduits 160, 162 and heater 156 are utilized to control the temperature of the base 148, thereby heating and/or cooling the electrostatic chuck 150 and ultimately, the temperature profile of the substrate W disposed thereon. The temperature of the electrostatic chuck 150 and the base 148 may be monitored using a plurality of temperature sensors 168, 170. The electrostatic chuck 150 may further comprise a plurality of gas passages (not shown), such as grooves, that are formed in a substrate support pedestal supporting surface of the electrostatic chuck 150 and fluidly coupled to a source of a heat transfer (or backside) gas, such as helium (He). In operation, the backside gas is provided at controlled pressure into the gas passages to enhance the heat transfer between the electrostatic chuck 150 and the substrate W.

In one implementation, the substrate support pedestal assembly 120 is configured as a cathode and includes the clamping electrode 152 that is coupled to a plurality of RF bias power sources 172, 174. The RF bias power sources 172, 174 are coupled between the clamping electrode 152 disposed in the substrate support pedestal assembly 120 and another electrode, such as the showerhead assembly 128 or the lid 104 of the chamber body 102. The RF bias power excites and sustains a plasma discharge formed from the gases disposed in the processing region of the chamber body 102.

In the example depicted in FIG. 1, the dual RF bias power sources 172, 174 are coupled to the clamping electrode 152 disposed in the substrate support pedestal assembly 120 through a matching circuit 176. The signal generated by the RF bias power sources 172, 174 is delivered through matching circuit 176 to the substrate support pedestal assembly 120 through a single feed to ionize the gas mixture provided in the ICP etch chamber 100, thereby providing ion energy necessary for performing a deposition or other plasma enhanced process. The RF bias power sources 172, 174 are generally capable of producing an RF signal having a frequency of from about 50 kHz to about 200 MHz and a power between about 0 Watts and about 5000 Watts. An additional bias power source 178 may be coupled to the clamping electrode 152 to control the characteristics of the plasma.

In one mode of operation, the substrate W is disposed on the substrate support pedestal assembly 120 in the ICP etch chamber 100. A process gas and/or gas mixture is introduced into the chamber body 102 through the showerhead assembly 128 from the gas panel 122. The vacuum pump system 114 maintains the pressure inside the chamber body 102 while removing deposition by-products.

A controller 180 is coupled to the ICP etch chamber 100 to control operation of the ICP etch chamber 100. The controller 180 includes a central processing unit (CPU) 182, a memory 184, and a support circuit 186 utilized to control the process sequence and regulate the gas flows from the gas panel 122. The CPU 182 may be any form of general purpose computer processor that may be used in an industrial setting. The software routines can be stored in the memory 184, such as random access memory, read only memory, floppy, or hard disk drive, or other form of digital storage. The support circuit 256 is conventionally coupled to the CPU 182 and may include cache, clock circuits, input/output systems, power supplies, and the like. Bi-directional communications between the controller 180 and the various components of the ICP etch chamber 100 are handled through numerous signal cables.

Figure 2:
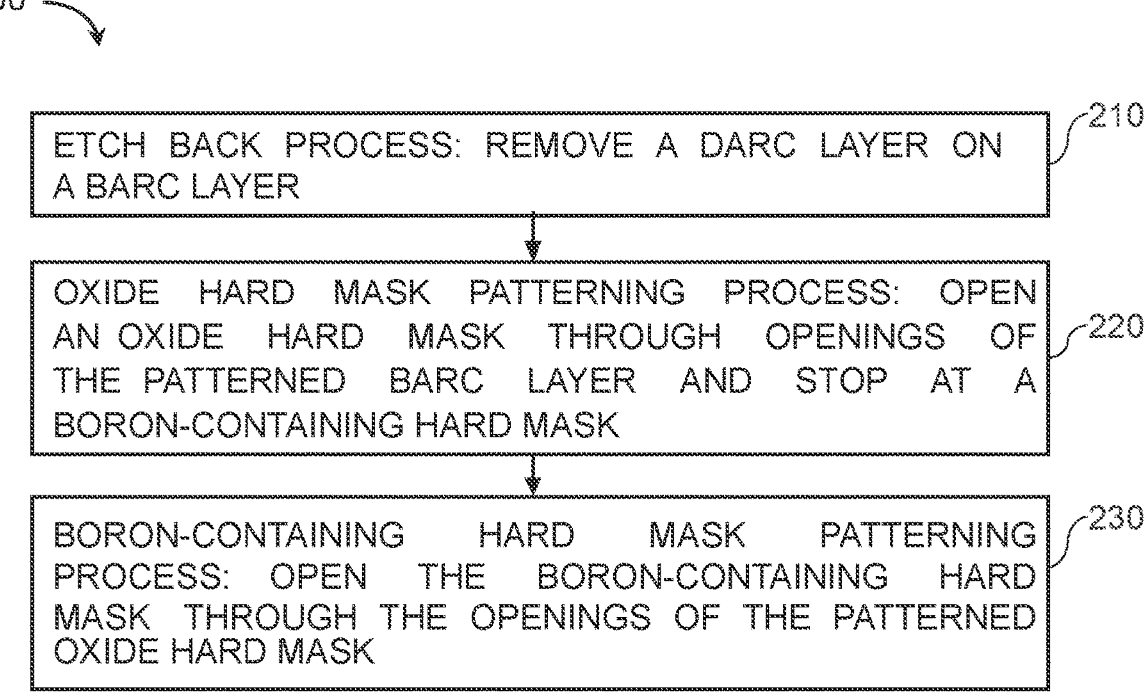
FIG. 2 depicts a flow diagram for a patterning process according to one embodiment.

FIG. 2 depicts a process flow diagram of a method 200 of forming a semiconductor structure 300 that may form a high aspect ratio structure, such as a DRAM capacitor or a 3D NAND device, according to one or more embodiments of the present disclosure. FIGS. 3A, 3B, 3C, and 3D are cross-sectional views of a portion of the semiconductor structure 300 corresponding to various states of the method 200. It should be understood that FIGS. 3A, 3B, 3C, and 3D illustrate only partial schematic views of the semiconductor structure 300, and the semiconductor structure 300 may contain any number of transistor sections and additional materials having aspects as illustrated in the figures. It should also be noted that although the method illustrated in FIG. 2 is described sequentially, other process sequences that include one or more operations that have been omitted and/or added, and/or has been rearranged in another desirable order, fall within the scope of the embodiments of the disclosure provided herein.

Figures 3A, 3B, 3C, 3D:
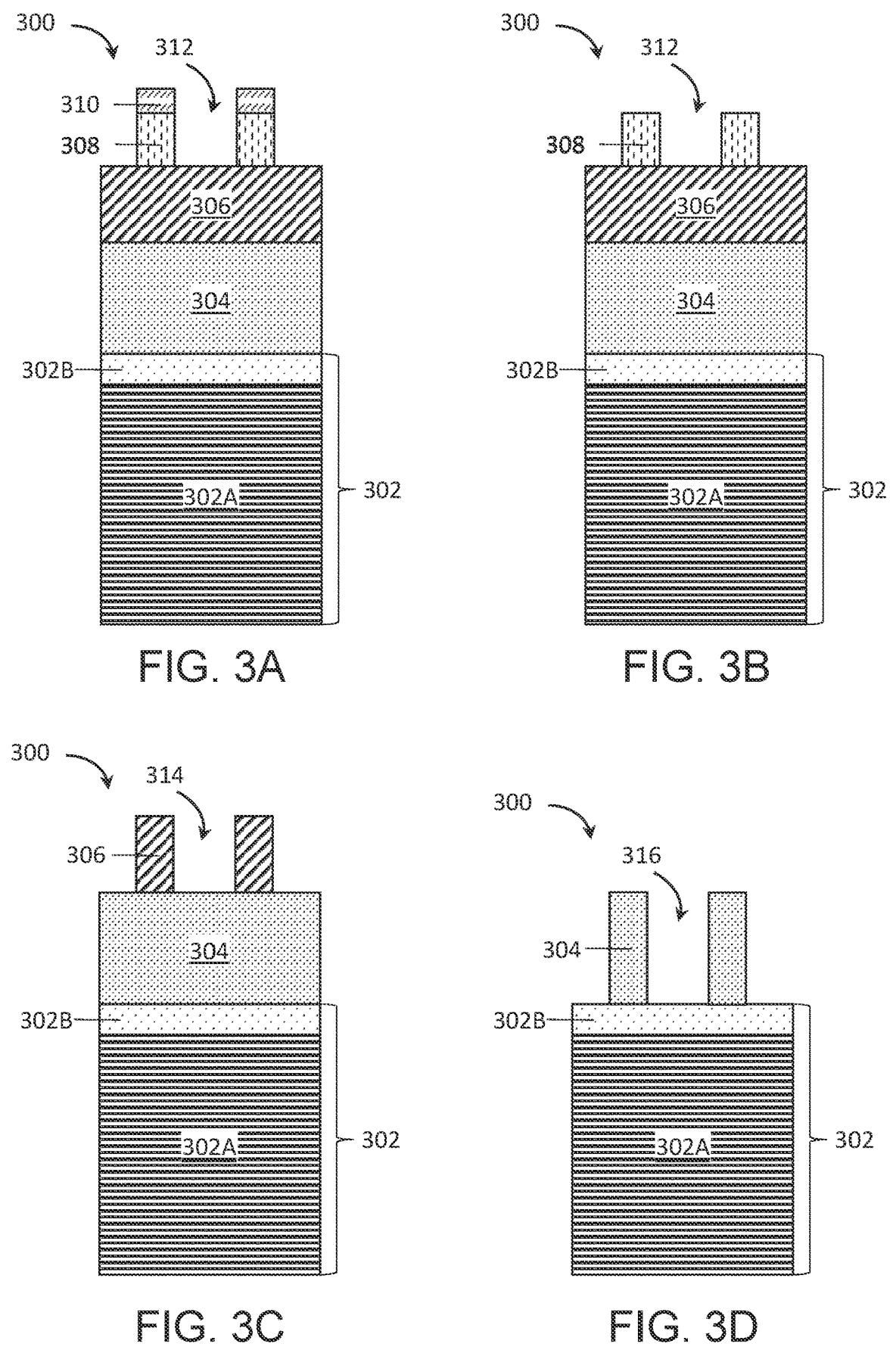

As shown in FIG. 3A, the semiconductor structure 300 includes a film stack 302 formed on a substrate (not shown). The film stack 302 may include a stacking mold 302A of alternating silicon oxide ($SiO_2$) layers and silicon nitride ($Si_3N_4$) layers, and a dielectric layer 302B formed on the stacking mold 302A. The stacking mold 302A may have a thickness of between about 5000 Å and about 20 μm, for example, about 3 μm. In some embodiments, the stacking mold 302A may be alternating silicon (Si) layers and silicon oxide ($SiO_2$) layers. The dielectric layer 302B may be formed of silicon carbonitride (SiCN) and have a thickness of between about 100 Å and about 10000 Å, for example, about 1000 Å.

The substrate may be any one of semiconductor substrates, silicon wafers, glass substrates and the like. The substrate may be formed of a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate may have various dimensions, such as 200 mm, 300 mm, 450 mm, or other diameter, as well as being a rectangular or square panel.

The semiconductor structure 300 further includes a boron-containing hard mask 304 formed on the film stack 302, and an oxide hard mask 306 formed on the boron-containing hard mask 304.

Concentration of boron (B) in the boron-containing hard mask 304 may be between about 20% and about 100% of boron (B). The boron-containing hard mask 304 may further include one or more of silicon (Si), germanium (Ge), carbon (C), arsenic (As), antimony (Sb), oxygen (O), nitrogen (N), phosphorus (P), and hydrogen (H). Increased content of boron (B) may increase etch selectivity (i.e., ratio of etch rates) of the boron-containing hard mask 304 against the underlying film stack 302.

The boron-containing hard mask 304 having a high concentration of boron (B) (e.g., 90% or greater) may have a high etch selectivity (e.g., 3 to 1 or greater) against the film stack 302 (e.g., $SiO_2$), but a low etch selectivity (e.g., 2 to 1 or lower) against the oxide hard mask 306. Thus, to pattern the boron-containing hard mask 304, a thicker oxide hard mask 306 may be required, which increases aspect ratio in the patterning and worsens local CD uniformity (LCDU) in the patterned boron-containing hard mask 304. Further, due to difficulty in directly oxidizing boron (B) and lack of silicon (Si) in the boron-containing hard mask 304 having a high concentration of boron (B), sidewall passivation by oxide, such as silicon oxide ($SiO_2$), within the openings of the patterned boron-containing hard mask 304 is not sufficient, which also worsens LCDU.

In the embodiments described herein, the boron-containing hard mask 304 may be doped with one or more metal elements, such as tungsten (W), gold (Au), chromium (Cr), ion (Fe), gallium (Ga), hafnium (Hf), molybdenum (Mo), niobium (Nb), tin (Sn), tantalum (Ta), vanadium (V), zirconium (Zr), or any combination thereof. Concentration of the metal elements in the boron-containing hard mask 304 is between about 0.5% and about 80%. The addition of metal dopants to the boron-containing hard mask 304 increases etch selectivity to the oxide hard mask 306, for example, to greater than 8.0 (a metal-doped boron-containing hard mask) from about 2.0 (a non-metal doped boron-containing hard mask). Thus, to pattern the boron-containing hard mask 304, a thinner oxide hard mask 306 may be needed, which decreases aspect ratio in the patterning and improves LCDU in the patterned boron-containing hard mask 304. Further, the addition of metal dopants to the boron-containing hard mask 304 promotes formation of metal oxides, such as tungsten oxide ($W_2O_3$), which assists formation of boron oxide ($B_2O_3$) within the openings of the patterned boron-containing hard mask 304. This passivation layer formed of boron oxide ($B_2O_3$) also improves LCDU in the patterned boron-containing hard mask 304.

The boron-containing hard mask 304 may have a thickness of between about 500 Å and about 5000 Å, for example, about 3000 Å.

The boron-containing hard mask 304 may be formed by any conventional deposition process, such as a chemical vapor deposition (CVD) process, a physical vapor deposition (PVD) process, an atomic layer deposition (ALD) process, a spin-on-coating process, a spray coating process, or other suitable deposition processes.

The oxide hard mask 306 may be formed of silicon oxide ($SiO_2$) and deposited by a deposition process such as CVD or plasma-assisted CVD in which tetra-ethyl-orthosilicate (TEOS) is employed as a precursor source gas.

The oxide hard mask 306 may have a thickness of between about 100 Å and about 3000 Å, for example, about 1000 Å.

The semiconductor structure 300 further includes a carbon-containing hard mask 308 formed on the oxide hard mask and a anti-reflective coating (ARC) layer 310 formed on the carbon-containing hard mask 308. The carbon-containing hard mask 308 and the ARC layer 310 have been already patterned to have openings 312 by a double patterning lithography technique. The ARC layer 310 may include a dielectric anti-reflective coating (DARC) layer formed of silicon oxynitride (SiON) and a bottom anti-reflective coating (BARC) layer on the DARC layer, for reducing surface reflection, thus maximizing light collection efficiency in lithography.

The carbon-containing hard mask 308 may be formed of carbon-containing material, such as boron doped amorphous carbon. The carbon-containing hard mask 308 may be a Saphira™ Advanced Patterning Film (APF) carbon hard mask produced by Applied Materials, Inc., located in Santa Clara, Calif. The carbon-containing hard mask 308 may have a thickness of between about 100 Å and about 3000 Å, for example, about 1000 Å.

The ARC layer 310 may have a thickness of between about 100 Å and about 1000 Å, for example, about 350 Å.

The openings 312 in the carbon-containing hard mask 308 and the ARC layer 310 may have a critical dimension (CD) of between about 10 nm and about 100 nm, and LCDU of less than about 3 nm.

The method 200 begins with block 210, in which an etch back process is performed to remove the ARC layer 310 on the carbon-containing hard mask 308, as shown in FIG. 3B. The etch back process may include a plasma etch using a gas mixture of $O_2$, $CF_4$, $CHF_3$, and $CH_2F_2$.

In block 220, an oxide hard mask patterning process is performed to open the oxide hard mask 306 through the openings 312 of the patterned carbon-containing hard mask 308 and stop at the boron-containing hard mask 304, as shown in FIG. 3C. The openings 312 of the carbon-containing hard mask 308 are transferred to openings 314 of the patterned oxide hard mask 306. The openings 314 in the oxide hard mask 306 may have a critical dimension (CD) of between about 10 nm and about 100 nm, and LCDU of less than about 3 nm.

The oxide hard mask patterning process may include a plasma etch using a gas mixture of $C_4F_6$, $C_4F_8$, Ar, and $O_2$. The carbon-containing hard mask 308 is subsequently stripped by ashing using $O_2$.

In block 230, a boron-containing hard mask patterning process is performed to open the boron-containing hard mask 304 through the openings 314 of the patterned oxide hard mask 306, as shown in FIG. 3D. The openings 314 of the oxide hard mask 306 are transferred to openings 316 of the patterned boron-containing hard mask 304. The openings 314 in the oxide hard mask 306 may have a critical dimension (CD) of between about 10 nm and about 100 nm, and LCDU of less than about 3 nm.

The boron-containing hard mask patterning process may include a plasma etching using an etching gas mixture in a processing chamber, such as the etch chamber 100 depicted in FIG. 1 while maintaining a chamber temperature between −100° C. and up to about 450° C.

The etching gas mixture includes etchants, such as chlorine ($Cl_2$) and hydrogen bromide (HBr), and a reacting gas, such as oxygen ($O_2$). In the boron-containing hard mask 304, boron (B) reacts with the etchants to form volatile byproducts, such as boron trichloride ($BCl_3$), and metal dopants, such as tungsten (W), react with $Cl_2$ and $O_2$ to form volatile byproducts, such as tungsten chloride ($WCl_x$) and tungsten oxychloride ($WO_xCl_y$). Thus, the addition of metal dopants to the boron-containing hard mask 304 increases etch selectivity to the oxide hard mask 306. The reacting gas $O_2$ promotes formation of passivation layers formed of silicon oxide ($SiO_2$) on sidewalls of the openings 316 of the patterned boron-containing hard mask 304. Further, the volatile byproducts, such as boron trichloride ($BCl_3$), react with metal oxide, such as tungsten oxide ($W_2O_3$) to form boron oxide ($B_2O_3$), which may act as a passivation layer on sidewalls of the openings 316 of the patterned boron-containing hard mask 304. The metal oxychloride byproducts, such as tungsten oxychloride ($WO_xCl_y$), may decompose, in plasma, to form metal oxide, such as tungsten oxide ($W_2O_3$), which may promote formation of boron oxide ($B_2O_3$) that acts as a passivation layer on sidewalls of the openings 316 of the patterned boron-containing hard mask 304. Thus, the addition of metal dopants to the boron-containing hard mask 304 provides controllable sidewall passivation in the openings 316 of the patterned boron-containing hard mask 304, which reduces etch variability and defect (e.g., LCDU improvement) when the patterned boron-containing hard mask 304 is used to etch the underlying film stack 302.

In some embodiments, the etching gas mixture further includes a fluorine-containing gas, such as nitrogen trifluoride gas ($NF_3$) and hydrofluorocarbons ($C_xH_yF_z$). The metal dopants, such as tungsten (W), reacts with fluorine (F) to form non-volatile byproducts, such as tungsten fluoride ($WF_4$), on the patterned oxide hard mask 306, which prevents clogging of the openings 312 of the oxide hard mask 306 and thus increases etch selectivity to the oxide hard mask 306 and improves LCDU in the patterned boron-containing hard mask 304. The clogging of the openings 312 may prevent etchant gas from passing through the openings 312, and thus reduces etch selectivity. Further, the clogging of the opening may cause ion-deflection in plasma and thus cause profile bowing, which worsens LCDU.

In some embodiments, the etching gas mixture further include metal-containing etchant gas, such as tungsten hexafluoride ($WF_6$), tin chloride ($SnCl_4$), or other gas containing gold (Au), chromium (Cr), ion (Fe), gallium (Ga), hafnium (Hf), molybdenum (Mo), niobium (Nb), tantalum (Ta), vanadium (V), zirconium (Zr), or any combination thereof, to provide metal elements, such as tungsten (W) or tin (Sn), in the patterning process, alternative to or in addition to the metal dopants, such as tungsten (W) or tin (Sn), in the boron-containing hard mask 304.

During etching, the chamber pressure of the etching gas mixture is also regulated. In one or more embodiments, a process pressure in the processing chamber is regulated between about 2 mTorr to about 100 mTorr, for example, at about 3 mTorr and 20 Torr, such as about 6 mTorr. RF source or bias power may be applied to maintain a plasma formed from a continuous mode or a pulsed mode as needed in presence of the etching gas mixture. For example, an RF power source with a frequency of about 13.56 MHz may be applied at an energy level of between about 50 watts to about 5,000 watts, such as about 500 watts, to an inductively coupled antenna source to maintain a plasma inside the processing chamber. In addition, an RF bias power, with a frequency of between about 2 MHz and about 13.56 MHZ, may be applied at an energy level of between about 50 watts to about 5,000 watts, such as about 4500 watts.

In one or more examples, the RF bias power and the RF power source may be pulsed in the processing chamber during the etching. The RF bias power and the RF power source may be synchronized or non-synchronized pulsed into the processing chamber. In some examples, the RF bias power and the RF power source are non-synchronized pulsed into the processing chamber. For example, the RF power source may be pulsed to the processing chamber prior to pulsing the RF bias power. For example, the RF bias power may be in pulse mode synchronized with the RF power source or with a time delay with respect to the RF power source. In one or more examples, the RF power source and the RF bias power are pulsed between about 5% and about 75% of each duty cycle. Each duty cycle, for example between each time unit is between about 0.1 millisecond (ms) and about 10 ms.

In one example of the etching gas mixture, chlorine ($Cl_2$) gas may be supplied at a rate between about 50 sccm and about 1000 sccm, hydrogen bromide (HBr) gas may be supplied at a rate between about 50 sccm and about 1000 sccm, and oxygen ($O_2$) gas may be supplied at a rate between about 5 sccm and about 300 sccm into the processing chamber. A fluorine-containing gas, such as nitrogen trifluoride gas ($NF_3$) may be supplied at a flow rate between about 1 sccm and about 50 sccm. A metal-containing gas, such as tungsten hexafluoride ($WF_6$) may be supplied at a flow rate between about 1 sccm and about 50 sccm.

In the embodiments described herein, boron-containing hard masks used for high aspect ratio device patterning and methods for forming the same are provided. By introducing metal elements, either as metal dopants in a boron-containing hard mask or an etchant in patterning a boron-containing hard mask, selectivity of the boron-containing hard mask against an oxide hard mask to be used to pattern the boron-containing hard mask is increased, and sidewall passivation by boron oxide with the assistance of metal oxide within openings of the patterned boron-containing hard mask is formed. Therefore, local critical dimension uniformity (LCDU) of the openings in the patterned boron-containing hard mask is improved and etch variability in the high aspect ratio device patterning is reduced.

While the foregoing is directed to embodiments of the present disclosure, other and further embodiments of the disclosure may be devised without departing from the basic scope thereof, and the scope thereof is determined by the claims that follow.

What is claimed is:

1. A method for patterning a boron-containing hard mask, comprising:

patterning an oxide hard mask formed on a boron-containing hard mask; and patterning the boron-containing hard mask using the patterned oxide hard mask, wherein the oxide hard mask comprises silicon oxide ($SiO_2$), the boron-containing hard mask is doped with one or more metal elements, and the patterning of the boron-containing hard mask comprises etching the boron-containing hard mask through openings of the patterned oxide hard mask using an etching gas mixture comprising chlorine ($Cl_2$), hydrogen bromide (HBr), and oxygen ($O_2$).

2. The method of claim 1, wherein concentration of boron in the boron-containing hard mask is between 20% and 99.5%.

3. The method of claim 1, wherein the one or more metal elements comprise tungsten (W).

4. The method of claim 1, wherein concentration of the one or more metal elements is between 0.5% and 80%.

5. The method of claim 4, wherein etch selectivity of the boron-containing hard mask to the oxide hard mask is greater than 8.

6. The method of claim 1, wherein the oxide hard mask has a thickness of between 100 Å and 3000 Å, and critical dimensions of the openings of the patterned oxide hard mask are between 10 nm and 100 nm.

7. The method of claim 1, wherein the boron-containing hard mask has a thickness of between 500 Å and 5000 Å, and openings of the patterned boron-containing hard mask are between 10 nm and 100 nm.

8. The method of claim 1, wherein the etching gas mixture further comprises a fluorine-containing gas.

9. A method for patterning a boron-containing hard mask, comprising:

patterning an oxide hard mask formed on a boron-containing hard mask; and patterning the boron-containing hard mask using the patterned oxide hard mask, wherein the oxide hard mask comprises silicon oxide ($SiO_2$), and the patterning of the boron-containing hard mask comprises etching the boron-containing hard mask through openings of the patterned oxide hard mask using an etching gas mixture comprising chlorine ($Cl_2$), hydrogen bromide (HBr), oxygen ($O_2$), and a metal-containing etchant.

10. The method of claim 9, wherein the metal-containing etchant comprises tungsten hexafluoride ($WF_6$) or tin chloride ($SnCl_4$).

11. The method of claim 9, wherein concentration of boron in the boron-containing hard mask is between 20% and 100%.

12. The method of claim 9, wherein the oxide hard mask has a thickness of between 100 Å and 3000 Å, and critical dimensions of the openings of the patterned oxide hard mask are between 10 nm and 100 nm.

13. The method of claim 9, wherein the boron-containing hard mask has a thickness of between 500 Å and 5000 Å, and openings of the patterned boron-containing hard mask are between 10 nm and 100 nm.

14. The method of claim 9, wherein the etching gas mixture further comprises a fluorine-containing gas.

15. A method for patterning a boron-containing hard mask, comprising:

patterning an oxide hard mask formed on a boron-containing hard mask; and patterning the boron-containing hard mask using the patterned oxide hard mask, wherein the oxide hard mask comprises silicon oxide ($SiO_2$), the boron-containing hard mask is doped with one or more metal elements, and the patterning of the boron-containing hard mask comprises etching the boron-containing hard mask through openings of the patterned oxide hard mask using an etching gas mixture comprising chlorine ($Cl_2$), hydrogen bromide (HBr), oxygen ($O_2$), and a metal-containing etchant.

16. The method of claim 15, wherein concentration of boron in the boron-containing hard mask is between 20% and 99.5%.

17. The method of claim 15, wherein the one or more metal elements comprise tungsten (W).

18. The method of claim 15, wherein concentration of the one or more metal elements is between 0.5% and 80%.

19. The method of claim 15, wherein the metal-containing etchant comprises tungsten hexafluoride ($WF_6$) or tin chloride ($SnCl_4$).

20. The method of claim 15, wherein the etching gas mixture further comprises a fluorine-containing gas.

* * * * *